United States Patent
Arai et al.

[11] Patent Number: 6,137,284
[45] Date of Patent: Oct. 24, 2000

[54] METHOD AND APPARATUS FOR DETECTING SUPPLY VOLTAGE

[75] Inventors: Youichi Arai; Syuji Satake; Kiyoshi Nakajima, all of Shizuoka, Japan

[73] Assignee: Yazaki Corporation, Tokyo, Japan

[21] Appl. No.: 09/328,010

[22] Filed: Jun. 8, 1999

[30] Foreign Application Priority Data

Jun. 11, 1998 [JP] Japan .................................. 10-163990

[51] Int. Cl.⁷ ................................................ G01R 33/00
[52] U.S. Cl. .................................. 324/117 H; 324/117 R
[58] Field of Search ............................. 324/117 R, 225, 324/117 H, 115, 251, 252, 99 R, 99 D; 338/32 R, 32 H; 327/510, 511

[56] References Cited

U.S. PATENT DOCUMENTS

| | | | |
|---|---|---|---|
| 4,215,310 | 7/1980 | Schwerer | 324/225 |
| 4,901,008 | 2/1990 | Quastel et al. | 324/117 H |
| 5,296,802 | 3/1994 | Beranger et al. | 324/117 R |
| 5,438,258 | 8/1995 | Maruyama | 324/142 |
| 5,497,077 | 3/1996 | Nukui | 324/117 H |
| 5,764,047 | 6/1998 | Massie | 324/117 R |
| 5,952,819 | 9/1999 | Berkcan et al. | 324/117 R |

FOREIGN PATENT DOCUMENTS 8-86813  4/1996  Japan ............................. G01R 15/20

*Primary Examiner*—Safet Metjahic
*Assistant Examiner*—Vincent Q. Nguyen
*Attorney, Agent, or Firm*—Sughrue, Mion, Zinn, Macpeak & Seas, PLLC

[57] ABSTRACT

A method and apparatus capable of detecting a considerably high voltage of a power supply while preventing an increase in the size and cost of circuitry, an increase in the amount of heat being generated, and a reduction in the detection accuracy of the circuitry. The voltage of a power supply to be detected is divided by way of a voltage-dividing resistor array. An voltage-to-current converter converts a potential difference appearing across the second voltage-dividing resistor in the array into a primary current so as to correspond to the potential difference. The converted primary current flows through a primary winding and an energization resistor. A second magnetic flux develops in a magnetic core from a secondary current, which flows through the secondary winding from a current buffer on the basis of the voltage output from a hole element according to the primary current. This second magnetic flux cancels the primary magnetic flux developed in the magnetic core from the primary current flowing through the primary winding and an energization load. As a result, a potential difference, which can be used for detecting the voltage of the power supply, develops across a detection load connected to the secondary winding.

5 Claims, 2 Drawing Sheets

METHOD AND APPARATUS FOR DETECTING SUPPLY VOLTAGE

BACKGROUND OF THE INVENTION

1. Field of the Invention

The present invention relates to a method and apparatus for detecting a supply voltage by means of the so-called zero-magnetic-flux method.

The present application is based on Japanese Patent Application No. Hei. 10-163990, which is incorporated herein by reference.

2. Description of the Related Art

The technology for detecting a voltage in a specific location of a circuit or a current flowing through the specific location in a non-contacting manner by utilization of the so-called zero-magnetic-flux method or zero-flux method has already been utilized in various fields. For example, Japanese Patent Application Laid-open No. Hei. 8-86813 discloses a circuit for detecting a voltage or current to be used for estimating the amount of current stored in the batteries of an electric car.

The principle of the zero-magnetic-flux method is described by reference to a circuit diagram which is shown in FIG. 2, which has been prepared by simplification of the circuit diagram referred to in Japanese Patent Application Laid-open No. Hei. 8-86813 in order to describe the related art.

As shown in FIG. 2, reference numeral 1 designates a toroidal core which assumes a substantially C-shaped form having a predetermined gap 1a; i.e., a magnetic core. A primary winding 3 and a secondary winding 5 are coiled around the magnetic core 1. In conjunction with the magnetic core 1, the primary winding 3 and the secondary winding 5 form a coil 4.

One end of an energization resistor 7A is connected to one end of the primary winding 3; the other end of the primary winding 3 forms a primary-side terminal 9a; and the other end of the energization resistor 7A forms another primary-side terminal 9b.

A hole element 11 is placed in the gap 1a of the magnetic core 1 for generating a voltage proportional to the magnetic flux developing in the magnetic core 1. After having been amplified by a differential amplifier circuit 13, the voltage output from the hole element 11 is delivered to a current buffer 15 formed by a push-pull circuit having an NPN transistor 15a and a PNP transistor 15b. The current buffer 15 supplies an electric current $i_2$ in the direction from a terminal 5a of the secondary winding to another terminal 5b of the same.

The circuit shown in FIG. 2 forms a servo system, in which an electric current which flows through the secondary winding 5 corresponds to the electric current that flows through the primary winding 3.

In the circuit shown in FIG. 2, when an electric current $i_1$, flows through the primary winding 3, a magnetic flux $\phi_1$ corresponding to the electric current $i_1$ develops in the magnetic core 1. Further, an output voltage corresponding to the current $i_1$ also arises in the hole element 11. After having been amplified through differential amplification by means of the differential amplifier circuit 13, the output voltage is delivered to the current buffer 15. The electric current $i_2$, which flows from the current buffer 15 in the direction from the terminal 5a of the secondary winding 5 to the terminal 5b of the same, generates a magnetic flux $\phi_2$ in the magnetic core 1 which cancels the magnetic flux $\phi_1$.

If this situation continues, the magnetic flux $\phi_2$ converges so as to become equal in magnitude to the magnetic flux $\phi_1$. Consequently, the magnetic core 1 reaches a magnetic equilibrium state, so that the voltage output from the hole element 11 assumes a value of zero.

As a result, the electric current that is supplied to the current buffer 15 after having been subjected to differential amplification in the differential amplifier circuit 13 decreases to zero, thereby diminishing the magnetic flux $\phi$ developing in the magnetic core 1. At the same instant, a voltage corresponding to the current $i_1$ that flows through the primary winding 3 again develops in the hole element 11, so that the magnetic flux $\phi_2$ again converges so as to become equal in magnitude to the magnetic flux $\phi_1$. Consequently, the coil 4 again reaches the magnetic equilibrium state.

More specifically, the magnetic flux $\phi_2$ always varies in the vicinity of the magnetic flux $\phi_1$, and the coil 4 always remains in a magnetic equilibrium state. This is the so-called zero-magnetic-flux principle.

In the state in which the coil 4 is in a magnetic equilibrium state, a relationship existing between the electric current $i_1$ that flows through the primary winding 3 and the electric current $i_2$ that flows through the secondary winding 5 is expressed by $i_1 \times N_1 = i_2 \times N_2$, provided that the number of turns of the primary winding 3 is $N_1$ and the number of turns of the secondary winding 5 is $N_2$.

The invention described in Japanese Patent Application Laid-open No. Hei. 8-86813 is specifically intended to apply a single power supply to a circuit which detects a voltage or current in a non-contacting manner in order to estimate the charge stored in the batteries of an electric car, through utilization of the zero-magnetic-flux method. However, the above-described invention encounters another, new problem, as will be described below.

More specifically, in order to detect the voltage of the power supply through use of the circuitry shown in FIG. 2, as indicated by dashed lines in FIG. 2, a power supply to be detected 17 is connected to the primary-side terminal 9a, and the other primary-side terminal 9b is grounded by way of the energization resistor 7A. Further, the terminal 5b of the secondary winding 5 is grounded by way of a detection load 21, and a potential difference develops across the detection load 21. This potential difference is multiplied by a predetermined coefficient.

In the case of detecting the power supply 17 through use of the foregoing circuit configuration, there arises a problem—not unique to the batteries of the electric car—of the energization resistor 7A developing a large amount of heat from the electric current $i_1$ flowing through the primary winding 3 due to the high voltage of the power supply 17, provided that the power supply 17 has a considerably high voltage. To prevent an increase in the amount of the heat developing in the energization resistor 7A, a resistor for use with high power (hereinafter called a "high-power resistor") must be used as the energization resistor 7A, thereby resulting in an increase in the size and cost of the circuitry.

Further, if the power supply 17 has a considerably high voltage, the rated capacity of the primary winding 3 must be increased, which in turn requires an increase in the value of resistance of the energization resistor 7A.

In contrast, if the resistance value of the energization resistor 7A is indiscriminately increased in order to increase the rated capacity of the primary winding 3, the magnetic flux $\phi_1$ developing in the magnetic core 1 diminishes by an amount equal to a reduction in the amount of the electric current $i_1$ flowing through the primary winding 3, thereby involving a reduction in the detection accuracy of the entire circuitry. Prevention of this reduction also raises another, new problem of a necessity for an increase in the number of turns $N_1$ of the primary winding 3.

The present invention has been conceived in view of the foregoing problem, and the object of the present invention is three-fold, to provide a method and apparatus for detecting a supply voltage that: (1) prevents an increase in the size and cost of circuitry, which would otherwise be caused by using a high-power resistor as an energization load; (2) prevents a reduction in the accuracy of detection of the entire circuitry, which would otherwise be caused by increasing the value of resistance of the energization load in order to increase the rated capacity of the primary winding; and (3) can be used with a power source of a considerably high voltage.

SUMMARY OF THE INVENTION

To this end, according to a first aspect of the present invention, there is provided a supply voltage detection method comprising the steps of:

wrapping a primary winding around a magnetic core having a predetermined gap;

wrapping a secondary winding around the magnetic core;

connecting an energization load to the primary winding in series;

causing a primary current to flow from a power supply to the primary winding, thus developing a primary magnetic flux in the magnetic core wherein the power supply provides the detected supply voltage;

producing, from the primary magnetic flux, in a magnetic-force/voltage converter element disposed in the gap of the magnetic core, a detection voltage corresponding to the magnitude of the primary current;

causing an electric current to flow from the power supply to be detected through a voltage-dividing resistor array, including at least two voltage-dividing resistors connected in series, when a secondary current, used for detecting the voltage of the power supply, is caused to flow by means of the detection voltage through the secondary winding such that a secondary magnetic flux developed in the magnetic core from the secondary current cancels the primary magnetic flux;

producing the primary current by detecting a voltage corresponding to a potential difference across a single resistor included in the voltage-dividing resistor array, and converting this detected voltage into an electric current thereby producing the primary current; and causing the thus-produced primary current to flow to the primary winding.

Preferably, a constant voltage is required for conversion of the primary current. The voltage converted is equal to the potential difference across the single resistor. The constant voltage is supplied from an electrically insulated power source by way of a transformer.

According to a second aspect of the present invention, there is provided a supply voltage detection apparatus including:

a magnetic core wrapped with primary and secondary windings, and having a predetermined gap wherein a primary magnetic flux is developed by the flow of a primary current from a power supply that is to be detected to the primary winding;

an energization load connected in series with the primary winding; and a magnetic-force/voltage converter element disposed in the gap of the magnetic core, wherein a detection voltage corresponding to the magnitude of the primary magnetic flux is generated; and a secondary current used for detecting the voltage of the power supply, is caused to flow by means of the detection voltage through the secondary winding such that a secondary magnetic flux developing in the magnetic core from the secondary current cancels the primary magnetic flux.

The supply voltage detection apparatus further comprises:

a voltage-dividing resistor array which includes at least two voltage-dividing resistors connected in series, and through which a current corresponding to the voltage of the power supply flows from the power supply; and a voltage-to-current converter for converting a potential difference across a single resistor included in the voltage-dividing resistor array into a current value corresponding to the potential difference, wherein the electric current flows through the primary winding as the primary current.

Preferably, in the supply voltage detection apparatus, the voltage-to-current converter is arranged so as to operate on the constant potential power supplied from a constant-voltage power supply. The constant-voltage power supply is arranged so as to generate the constant potential power from the induced electromotive force developing in the secondary side of the transformer whose primary side draws power from a power source.

According to the supply voltage detection method of the present invention, the potential difference across a single resistor included in the voltage-dividing resistor array, through which the electric current flows from the power supply to be detected, becomes greater with the value of resistance of the single resistor. The primary current resulting from voltage-to-current conversion of the potential difference becomes greater with the potential difference across the single resistor.

Consequently, even if the voltage of the power supply to be detected is considerably high, an increase in the value of resistance of the resistors included in the voltage-dividing resistor array does not involve a reduction in the primary current flowing through the primary winding.

Further, since the voltage of the power supply to be detected is not applied directly onto the energization load, there is no need to use a high-power resistor as the energization load even when the voltage of the power supply to be detected is considerably high.

The rated capacity of the voltage-dividing resistor array corresponds to the sum of rated capacities of individual resistors included in the voltage-dividing resistor array. For this reason, even when the voltage of the power supply to be detected is considerably high and the rated capacity of the voltage-dividing resistor array must be increased accordingly, there is no need to increase the rated capacity of each resistor included in the voltage-dividing resistor array in proportion to the increase in the rated capacity of the voltage-dividing resistor array.

Consequently, an increase in the size and cost of circuitry is prevented, which would otherwise be caused by use of a high-power resistor as an energization load or in a voltage-dividing resistor array. A reduction in the detection accuracy of the entire circuitry is prevented as well, which would otherwise be caused by increasing the value of resistance of the energization load in order to increase the rated capacity of the primary winding.

Further, under the supply voltage detection method according to the present invention, the power source that supplies the constant potential power required for converting the potential difference across a single resistor included in the voltage-dividing resistor array into the primary current, is electrically insulated. As a result, a problem in generation of a constant voltage can be reliably prevented, which would otherwise be caused by fluctuations in the voltage of the power source exerting direct influence on the constant voltage power source.

DETAILED DESCRIPTION OF THE PREFERRED EMBODIMENT

A supply voltage detection method in conjunction with a supply voltage detection apparatus will be described herein below, by reference to the accompanying drawings.

Figure 1:
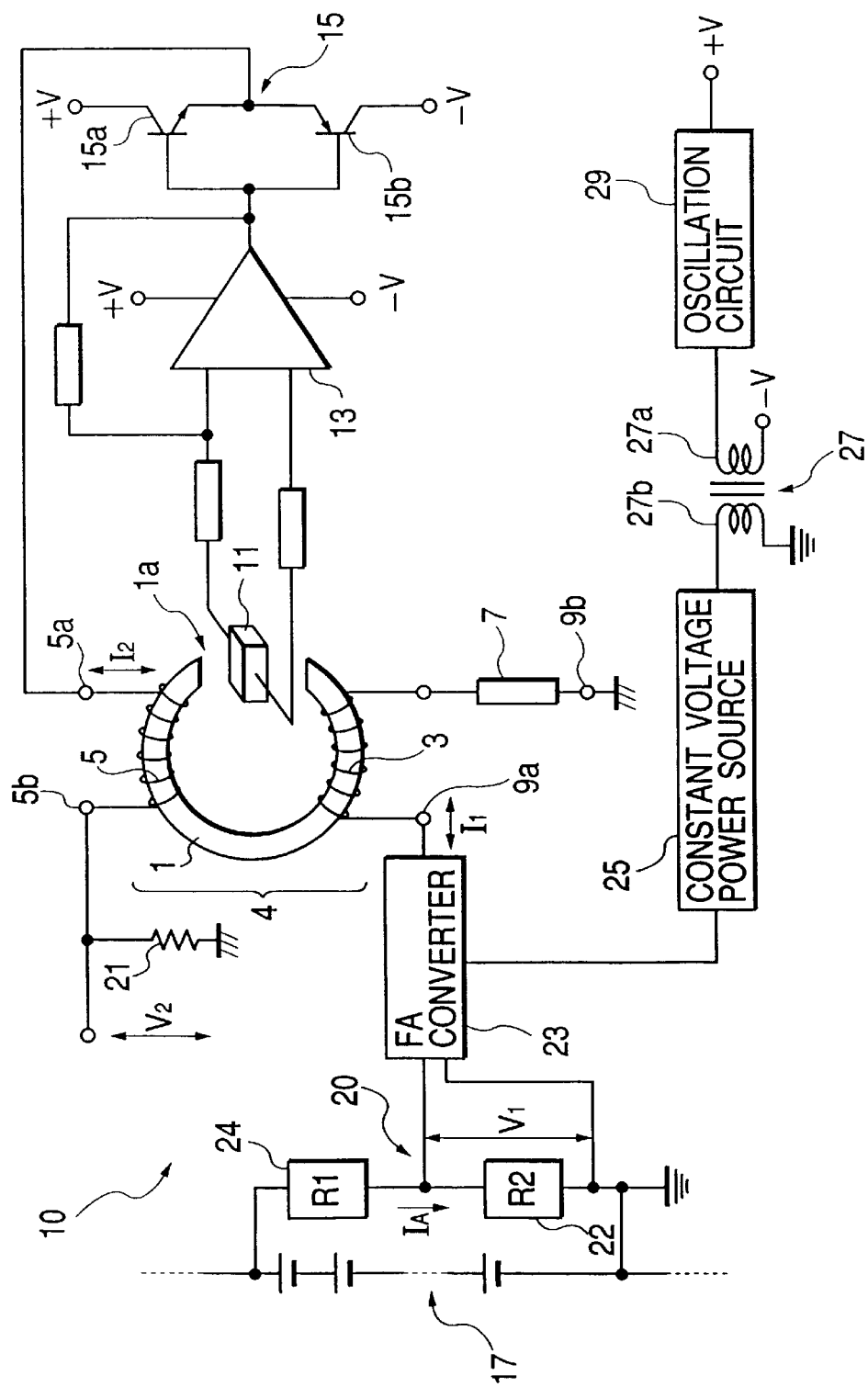
FIG. 1 is a circuit diagram showing the basic configuration of a supply voltage detection method according to one embodiment of the present invention.
Figure 2:
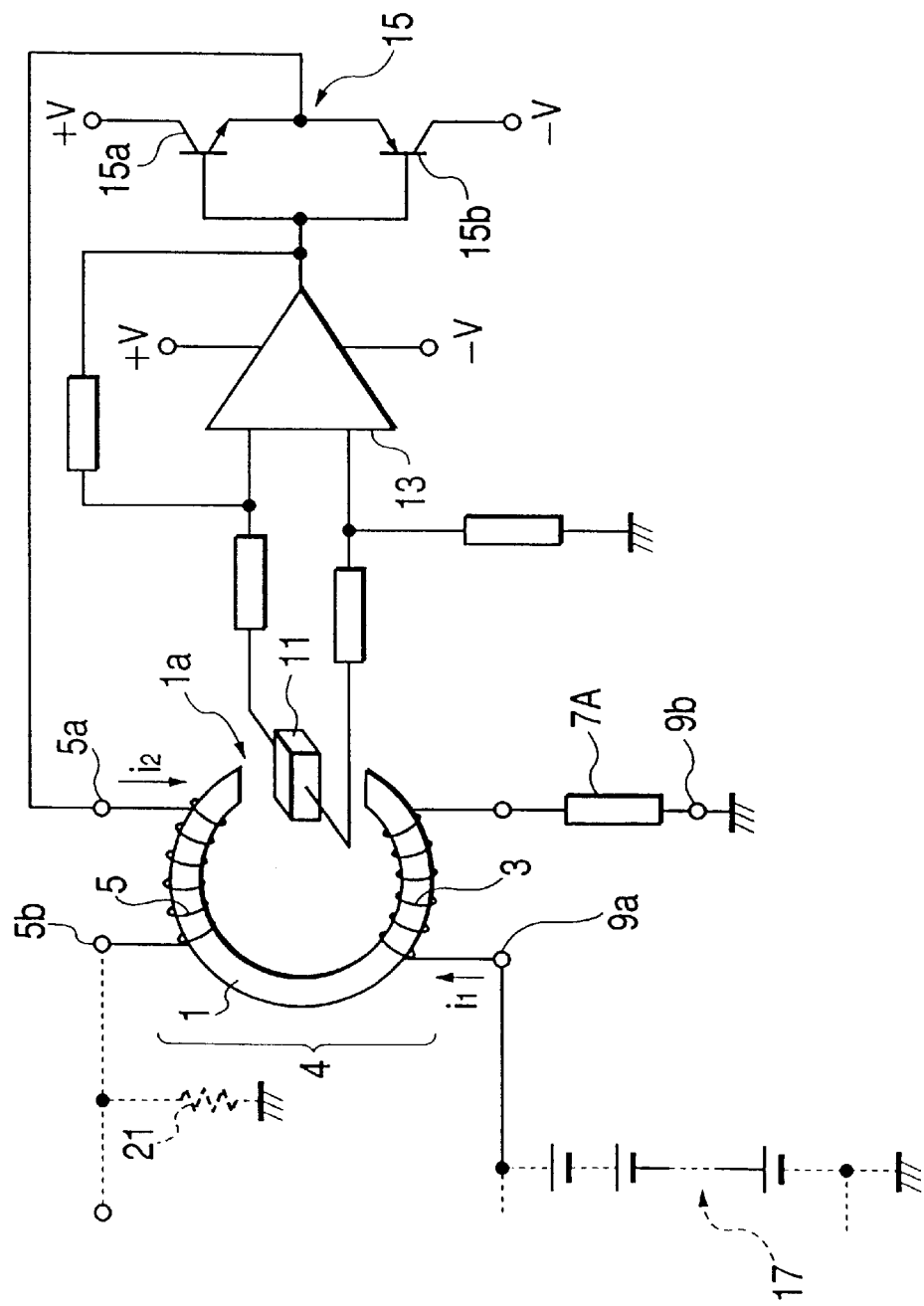
FIG. 2 is a circuit diagram for describing the principle of the zero-magnetic-flux method.

FIG. 1 is a circuit diagram showing the basic configuration of a supply voltage detector to which is applied a supply voltage detection method according to one embodiment of the present invention. The components or segments shown in FIG. 1 which are identical with those shown in FIG. 2 are assigned the same reference numerals as those employed in FIG. 2, and repetition of their explanations is omitted.

A supply voltage detection apparatus according to the present embodiment is assigned reference symbol 10 in FIG. 1 and is used for detecting the voltage stored in a power supply to be detected 17 which produces a considerably high voltage; for example, batteries used in an electric car. The supply voltage detection apparatus comprises a coil 4, a hole element 11, a differential amplifier 13, an electric current buffer 15, a detection load 21, a voltage-dividing resistor array 20, a voltage-to-current converter (hereinafter referred to as an "FA converter") 23, a constant-voltage power source 25, a transformer 27, and an oscillation circuit 29.

The coil 4 comprises: a magnetic core 1 formed from a toroidal core, having a substantially C-shaped form and a predetermined gap 1a; and, a primary winding 3 and a secondary winding 5, both of which are wrapped around the magnetic core 1. One end of an energization resistor 7 (corresponding to an energization load) is connected to one end of the primary winding 3, and the other end of the primary winding 3 forms a primary-side terminal 9a. The other end of the energization resistor 7 forms another primary-side terminal 9b.

The hole element 11 (corresponding to a magnetic-force/current converter element) is disposed in the gap 1a of the magnetic core 1 and is arranged so as to produce, a voltage proportional to the magnetic induction developed in the magnetic core 1. The differential amplifier circuit 13 is arranged so as to differentially amplify the voltage signal output from the hole element 11.

A current buffer 15 is formed by a push-pull circuit having an NPN transistor 15a and a PNP transistor 15b. By means of the voltage signal that is output from the hole element 11 and has been amplified by the differential amplifier circuit 13, a secondary current $I_2$ flows in the direction from the terminal 5a to the other terminal 5b or in the reverse direction. The detection load 21 is interposed between the terminal 5b of the secondary winding 5 and the ground.

The voltage-dividing resistor array 20 comprises a first voltage-dividing resistor (R1) 24 connected in series with a second voltage-dividing resistor (R2) 22 (all of which correspond to voltage-dividing resistors). The voltage-dividing resistor array 20 is connected across the positive and negative terminals of the power supply 17, and an electric current $I_A$ corresponding to the voltage of the power supply 17 flows through the voltage-dividing resistor array 20.

Both a resistance value $R_1$ of the first voltage-dividing resistor 24 and a resistance value $R_2$ of the second voltage-dividing resistor 22 are set to values greater than the resistance value of the energization resistor 7.

As a result of the electric current $I_A$ flowing through the voltage-dividing resistor array 20, a potential difference $V_1 = I_A \times R_1$ develops across the second voltage-dividing resistor 22 of the voltage-dividing resistor array 20. The FA converter 23 causes an electric current $I_1$ corresponding to the potential difference $V_1$ to flow through the primary winding 3 as the primary current.

The constant-voltage power source 25 supplies constant-potential power for activating the FA converter 23 and is connected in series with a secondary winding 27b of the transformer 27. A battery is connected in series with a primary winding 27a of the transformer 27 by way of the oscillation circuit 29. The constant voltage power source 25 is electrically insulated from the battery (corresponding to a power source) by way of the transformer 27.

In the transformer 27, AC power ±V is applied from an unillustrated power source to the primary winding 27a so as to correspond to the oscillation frequency of the oscillation circuit 29. A DC voltage develops in the secondary winding 27b from the induced electromotive force of the applied AC power ±V, and is provided as a power supply to the constant voltage power source 25.

The primary-side terminal 9a is connected to the FA converter 23, and the other primary-side terminal 9b is grounded. As a result, the primary current $I_1$ converted by the FA converter 23, flows through the primary winding 3 and the energization resistor 7 from the terminal 9a to the other terminal 9b.

The action (or operation) of the supply voltage detection apparatus according to the present embodiment having the foregoing structure will now be described.

The potential difference $V_1$ developing across the second voltage-dividing resistor (R2) 22 of the voltage-dividing resistor array 20 is converted by the FA converter 23 into the primary current $I_1$ corresponding to the potential difference $V_1$. When this primary current $I_1$ flows through the primary winding 3 and the energization resistor 7 from the terminal 9a to the other terminal 9b, a primary magnetic flux $\phi_1$ corresponding to the primary current $I_1$ develops in the magnetic core 1.

In conjunction with generation of the primary magnetic flux $\phi_1$, a voltage corresponding to the primary current $I_1$ develops in the hole element 11. This voltage is differentially amplified by means of the differential amplifier circuit 13, and is delivered to the current buffer 15. A secondary magnetic flux $\phi_2$ develops in the magnetic core 1 in such a direction as to cancel the primary magnetic flux $\phi_1$, by means of a secondary current $I_2$, which flows from the current buffer 15 in the direction from the terminal 5a to the other terminal 5b of the secondary winding 5 or in the reverse direction.

The potential difference $V_1$ developing across the second voltage-dividing resistor $R_2$ is lower than the voltage of the power supply 17. Further, as can be seen by a comparison of FIG. 1 and FIG. 2, respectively, the primary current $I_1$ that is produced from the potential difference $V_1$ by the FA converter 23 is lower than the current $i_1$ that flows through the primary winding 3 when the power supply 17 is connected to the terminal 9a.

Consequently, in the supply voltage detection apparatus 10 shown in FIG. 1, the rated capacity of the primary winding 3—through which flows the primary current $I_1$ corresponding to the potential difference $V_1$, which is lower than the voltage of the power supply 17—is lower than that of the primary winding 3 when the power supply 17 is connected to the terminal 9a.

When the secondary magnetic flux $\phi_2$ continuously develops in the magnetic core 1 from the secondary current $I_2$ which flows through the secondary winding 5 from the current buffer 15, in such a way as to cancel the primary magnetic flux $\phi_1$—the secondary magnetic flux $\phi_2$ converges to become equal in magnitude to the primary magnetic flux $\phi_1$. As a result, the magnetic core 1 reaches a magnetic equilibrium state, so that the voltage output from the hole element 11 assumes a value of zero.

The voltage that is output from the hole element 11 and is delivered to the current buffer 15 after differential amplification by the differential amplifier circuit 13 becomes zero, and hence the secondary magnetic flux $\phi_2$ developing in the magnetic core 1 diminishes.

At the same instant, the output voltage corresponding to the primary current $I_1$ that flows through the primary winding 3 again develops in the hole element 11. Hence, the secondary magnetic flux $\phi_2$ again converges to become equal to the primary magnetic flux $\phi_1$, thereby returning the coil 4 to a magnetic equilibrium state.

More specifically, the secondary magnetic flux $\phi_2$ always varies in the vicinity of the primary magnetic flux $\phi_1$, so that the coil 4 constantly remains in a magnetic equilibrium state. In terms of the number of turns $N_1$ of the primary winding 3 and the number of turns $N_2$ of the secondary winding 5, the relationship between the primary current $I_1$ and the secondary current $I_2$ is expressed by $I_1 \times N_1 = I_2 \times N_2$.

A potential difference $V_2$ across a detection load 21 is detected, and the voltage of the power supply 17 is determined by multiplying the potential difference $V_2$ by a predetermined coefficient.

To summarize, according to the present embodiment, the supply voltage detection apparatus 10 detects the voltage of the power supply 17 as follows. The voltage—which is output from the hole element 11 according to the primary current $I_1$ flowing through the primary winding 3 and the energization resistor 7—is differentially amplified by the differential amplification circuit 13 and is delivered to the current buffer 15. The secondary magnetic flux $\phi_2$ develops in the magnetic core 1 from the secondary current $I_2$ flowing from the current buffer 15 to the secondary winding 5. The thus-developing secondary magnetic flux $\phi_2$ cancels the primary magnetic flux $\phi_1$, which develops in the magnetic core 1 from the primary current $I_1$ flowing through the primary winding 3 and the energization resistor 7, thereby holding the coil 4 in a magnetic equilibrium state. As a result, the potential difference $V_2$, which can be used for detecting the voltage of the power supply 17, develops across the detection load 21 connected to the secondary winding 5. The following configuration is adopted for the supply voltage detection apparatus 10.

More specifically, the first voltage-dividing resistor (R1) 24 and the second voltage-dividing resistor (R2) 22, which together form the voltage-dividing resistor array 20 connected between the positive and negative terminals of the power supply 17, divide the voltage of the power supply 17. The potential difference $V_1$ appearing across the second voltage-dividing resistor 22 of the voltage-dividing resistor array 20 is correspondingly converted into the primary current $I_1$, and the primary current $I_1$ flows through the primary winding 3 and the energization resistor 7.

The potential difference $V_1$ developed across the second voltage-dividing resistor 22 may be increased by a corresponding increase in the resistance value $R_2$ of the second voltage-dividing resistor 22. The value of the primary current $I_1$ produced by the FA converter 23, is maintained so as to equal the value of the electric current which flows through the primary winding 3 when the power supply 17 is directly connected to the primary winding 13. Without increasing the number of turns $N_1$ of the primary winding 3, the potential difference $V_2$ developing across the detection load 21 connected to the secondary winding 5 can thus be prevented from decreasing to the point where it becomes insufficient for accurately detecting the voltage of the power supply 17.

The voltage of the power supply 17 is not directly applied to the energization resistor 7. Hence, even when the power supply 17 has a considerably high voltage, there is no need to employ a high-power resistor as the energization load 7, which would otherwise be required so as to correspond to the voltage of the power supply 17. Therefore, a rise in the cost due to the energization resistor 7 can be prevented.

The rated capacity of the voltage-dividing resistor array 20 corresponds to the sum of the rated capacity of the first voltage-dividing resistor (R1) 24 and that of the second voltage-dividing resistor (R2) 22. Hence, even when the power supply 17 has a considerably high voltage and the rated capacity of the voltage-dividing resistor array 20 must be increased so as to correspond to the voltage of the power supply 17, there is no need to increase the rated capacity of the first voltage-dividing resistor 24 and that of the second voltage-dividing resistor 22 in proportion to the increase in the rated capacity of the voltage-dividing resistor array 20.

To this end, there is no need to use a high-power resistor for the first and second voltage-dividing resistors 24 and 22, thereby preventing a rise in the cost due to the first and second voltage-dividing resistors R1 and R2.

While ensuring the foregoing advantageous result, the supply voltage detection apparatus can be used for detecting, without any drawback, a considerably high voltage of the power supply 17, such as the voltage of batteries for use with an electric car.

In the previous embodiment, the constant voltage power source 25, for supplying constant-potential power to activate the FA converter 23, generates constant-potential power from the power supplied by an unillustrated power supply, which is electrically insulated from the power source 25 by way of the transformer 27. The constant voltage power source 25 may also be activated on the power supplied from a battery which is electrically connected to the power source 25.

As in the previous embodiment, if the constant voltage power source 25 is activated on the power supplied from another power source electrically insulated from the power source 25 by way of the transformer 27, there is an advantage of reliably preventing fluctuations in the voltage of that power source from directly affecting and hindering generation of constant-potential power by the constant voltage power source 25.

Although in the previous embodiment the voltage-dividing resistor array 20 is formed from the first voltage-dividing resistor 24 connected in series with the second voltage-dividing resistor 22, the voltage-dividing resistor array may also be formed from three or more voltage-dividing resistors, so long as the voltage-dividing resistor array is formed from a plurality of voltage-dividing resistors connected together in series.

The resistance value of the respective voltage-dividing resistor may be set according to the design and configuration of the entire supply voltage detection apparatus 10, as required. Similarly, as a matter of course, the voltage-dividing resistor whose electric potential is converted into the primary current $I_1$ by the FA converter 23 may be arbitrarily selected according to the design and configuration of the overall supply voltage detection apparatus 10.

While preferred embodiments of the present invention have been described using specific terms, such description is for illustrative purposes only, and it is understood that changes and variations may be made by one skilled in the art without departing from the spirit or scope of the following claims.

What is claimed is:

1. A supply voltage detection method for detecting a detectable voltage of a power supply, comprising the steps of:

wrapping a primary winding around a magnetic core having a predetermined gap;

wrapping a secondary winding around said magnetic core;

connecting an energization load to said primary winding in series;

connecting a voltage-dividing array, including at least two voltage-dividing resistors connected in series, between the power supply and the primary winding;

supplying power from said power supply to said voltage-dividing array;

producing a primary current by detecting a first voltage corresponding to a potential difference across one of said two voltage-dividing resistors, and by converting the first voltage into the primary current;

causing the primary current to flow to said primary winding thus developing a primary magnetic flux in said magnetic core;

providing a magnetic-force/voltage converter partially in said gap which generates a second voltage corresponding to magnitude of the magnetic flux; and causing a secondary current to flow through said secondary windings by the second voltage such that a secondary magnetic flux developed in said magnetic core from said secondary current cancels the primary magnetic flux.

2. The supply voltage detection method of claim 1, further comprising the step of supplying a constant voltage, required for converting the first voltage into said primary current, from an electrically insulated power source by way of a transformer.

3. A supply voltage detection apparatus for detecting a detectable voltage of a power supply, said apparatus comprising:

a magnetic core wrapped with primary and secondary windings and having a predetermined gap, wherein a primary magnetic flux is developed by flow of a primary current from said power supply to said primary winding;

an energization load connected in series with said primary winding;

a magnetic-force/voltage converter partially disposed in the gap of said magnetic core, said magnetic-force/voltage converter generating a primary voltage corresponding to magnitude of said primary magnetic flux, said primary voltage causing a secondary current to flow through said secondary winding to produce a secondary magnetic flux in said magnetic core whereby the primary magnetic flux is canceled;

a voltage-dividing resistor array, including at least two voltage-dividing resistors connected in series, connected to the power supply such that a current, corresponding to the detectable voltage, flows from said power supply; and a voltage-to-current converter disposed between said voltage-dividing resistor array and said primary winding for converting a potential difference across one of said two voltage-dividing resistors of said voltage-dividing resistor array into a current value corresponding to said potential difference, whereby an electric current flows through said primary winding as the primary current.

4. The supply voltage detection apparatus of claim 3, further comprising:

a constant-voltage power supply electrically connected to said voltage-to-current converter for generating a constant potential power which operates said voltage-to-current converter;

a transformer having primary and secondary transforming windings, wherein said constant-voltage power supply is connected to said secondary transforming winding so as to be powered by an induced electromotive force developed in a secondary side of the transformer; and a power source for supplying power to the primary winding of said transformer.

5. The supply voltage detection apparatus of claim 3, further comprising a current buffer disposed between said magnetic-force/voltage converter and said secondary winding.

* * * * *